(12) United States Patent
Khare et al.

(10) Patent No.: US 9,006,816 B2
(45) Date of Patent: Apr. 14, 2015

(54) MEMORY DEVICE HAVING MULTIPLE DIELECTRIC GATE STACKS AND RELATED METHODS

(71) Applicants: STMicroelectronics, Inc., Coppell, TX (US); International Business Machines Corporation, Armonk, NY (US)

(72) Inventors: Prasanna Khare, Schenectady, NY (US); Stephane Allegret-Maret, Grenoble (FR); Nicolas Loubet, Guilderland, NY (US); Qing Liu, Guilderland, NY (US); Hemanth Jagannathan, Guilderland, NY (US); Lisa Edge, Watervliet, NY (US); Kangguo Cheng, Schenectady, NY (US); Bruce Doris, Slingerlands, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/852,645

(22) Filed: Mar. 28, 2013

(65) Prior Publication Data

US 2014/0291749 A1    Oct. 2, 2014

(51) Int. Cl.
*H01L 29/792*  (2006.01)
*H01L 21/28*  (2006.01)
*H01L 29/423*  (2006.01)
*H01L 29/66*  (2006.01)
*H01L 29/788*  (2006.01)
*H01L 27/115*  (2006.01)

(52) U.S. Cl.
CPC ........ *H01L 29/792* (2013.01); *H01L 21/28273* (2013.01); *H01L 29/42324* (2013.01); *H01L 29/66825* (2013.01); *H01L 29/7881* (2013.01); *H01L 27/11546* (2013.01)

(58) Field of Classification Search
USPC ............. 257/314, 411, 365, E21.176–E21.21
See application file for complete search history.

(56) References Cited

U.S. PATENT DOCUMENTS

| | | | |
|---|---|---|---|
| 5,976,926 A | 11/1999 | Wu et al. | |
| 6,990,016 B2 | 1/2006 | King | |
| 7,061,053 B2 | 6/2006 | Yano et al. | |
| 7,138,685 B2 | 11/2006 | Hsu et al. | |
| 7,817,459 B2 | 10/2010 | Lin | |
| 7,990,756 B2 | 8/2011 | Nakamura | |
| 2004/0262635 A1 | 12/2004 | Lee | |
| 2005/0017312 A1 | 1/2005 | Jeng et al. | |
| 2008/0128782 A1* | 6/2008 | Chen et al. | 257/316 |

(Continued)

*Primary Examiner* — Cuong Q Nguyen
*Assistant Examiner* — Nishath Yasmeen
(74) *Attorney, Agent, or Firm* — Allen, Dyer, Doppelt, Milbrath & Gilchrist, P.A.

(57) ABSTRACT

A memory device may include a semiconductor substrate, and a memory transistor in the semiconductor substrate. The memory transistor may include source and drain regions in the semiconductor substrate and a channel region therebetween, and a gate stack. The gate stack may include a first dielectric layer over the channel region, a first diffusion barrier layer over the first dielectric layer, a first electrically conductive layer over the first diffusion barrier layer, a second dielectric layer over the first electrically conductive layer, a second diffusion barrier layer over the second dielectric layer, and a second electrically conductive layer over the second diffusion barrier layer. The first and second dielectric layers may include different dielectric materials, and the first diffusion barrier layer may be thinner than the second diffusion barrier layer.

14 Claims, 10 Drawing Sheets

(56) References Cited

U.S. PATENT DOCUMENTS

| | | |
|---|---|---|
| 2008/0169520 A1 | 7/2008 | Kiyomura et al. |
| 2009/0278187 A1 | 11/2009 | Toba |
| 2010/0044770 A1* | 2/2010 | Lee .............................. 257/315 |
| 2010/0133623 A1* | 6/2010 | Inumiya et al. ............... 257/369 |
| 2010/0164011 A1* | 7/2010 | Frank et al. ................... 257/369 |
| 2011/0070726 A1* | 3/2011 | Dickenscheid et al. ...... 438/591 |
| 2011/0233681 A1 | 9/2011 | Matsuo |
| 2011/0305088 A1 | 12/2011 | Huang et al. |
| 2012/0248595 A1 | 10/2012 | Or-Bach et al. |

\* cited by examiner

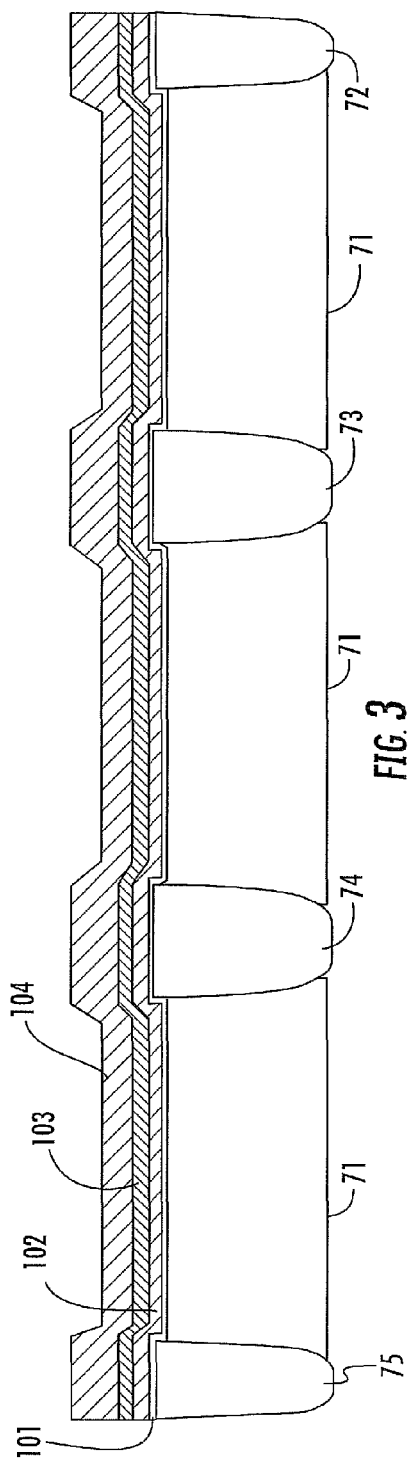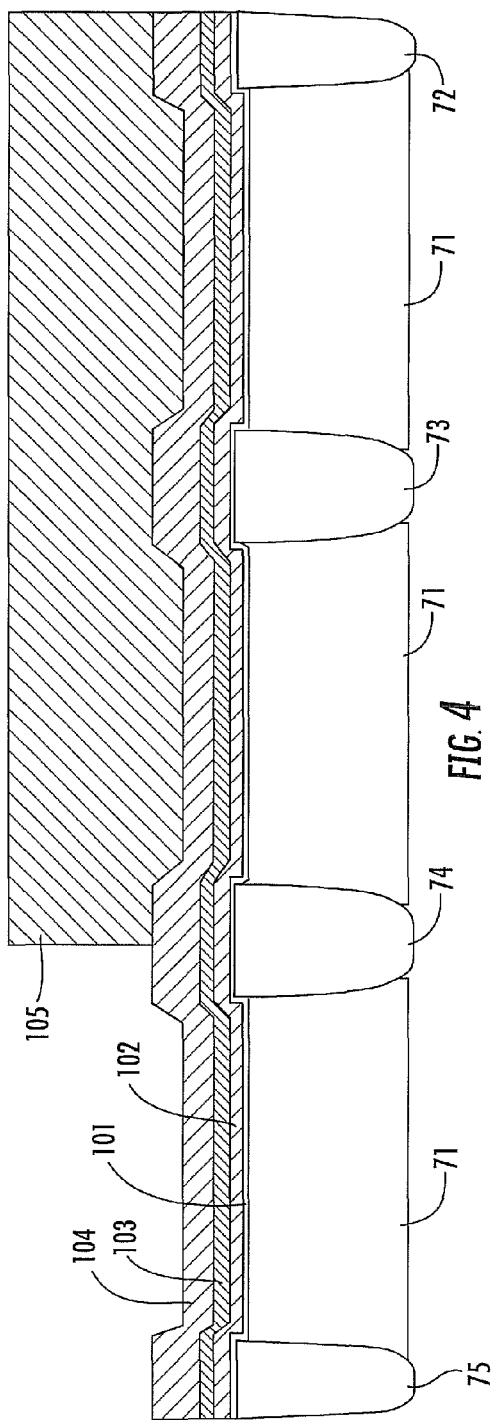

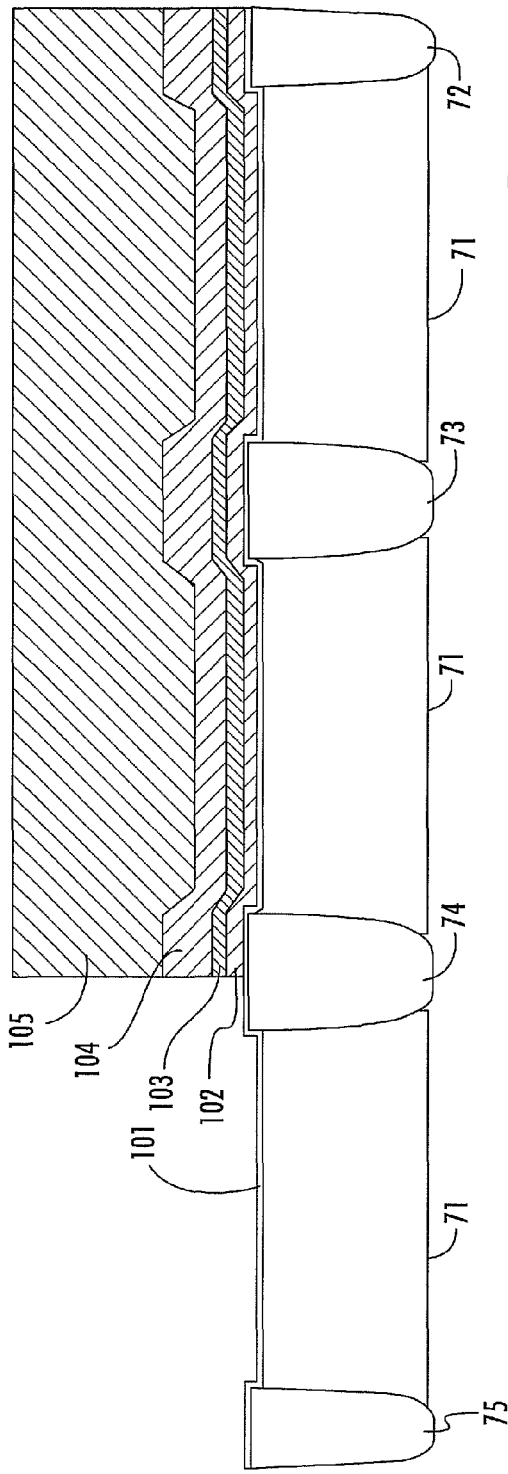
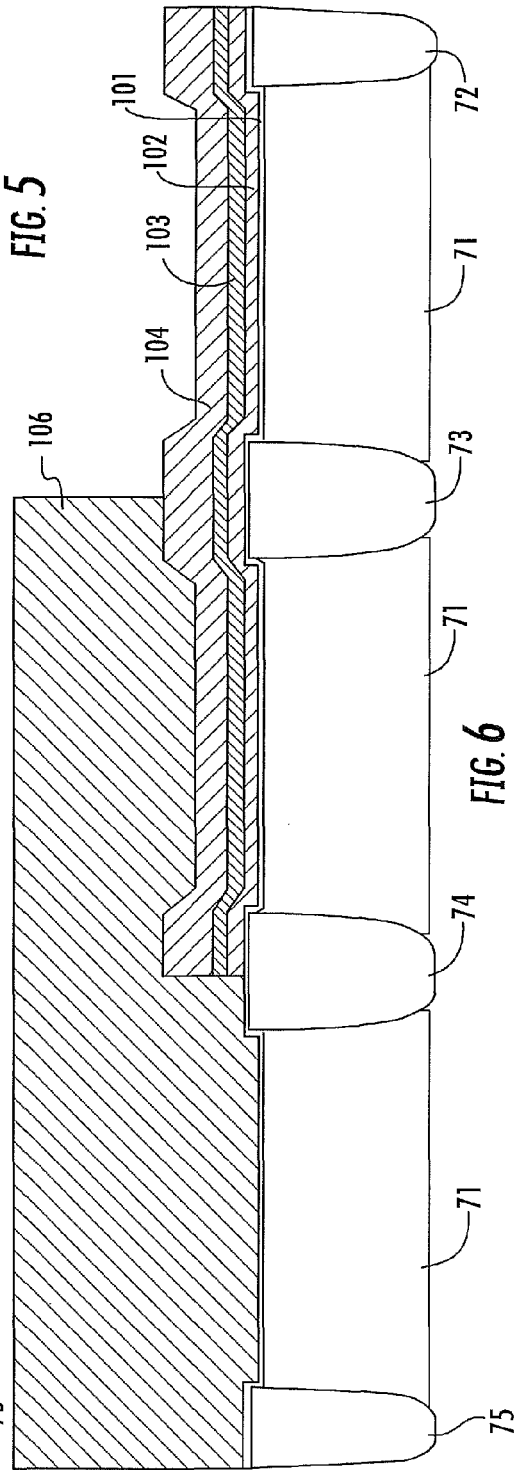
FIG. 5
FIG. 6

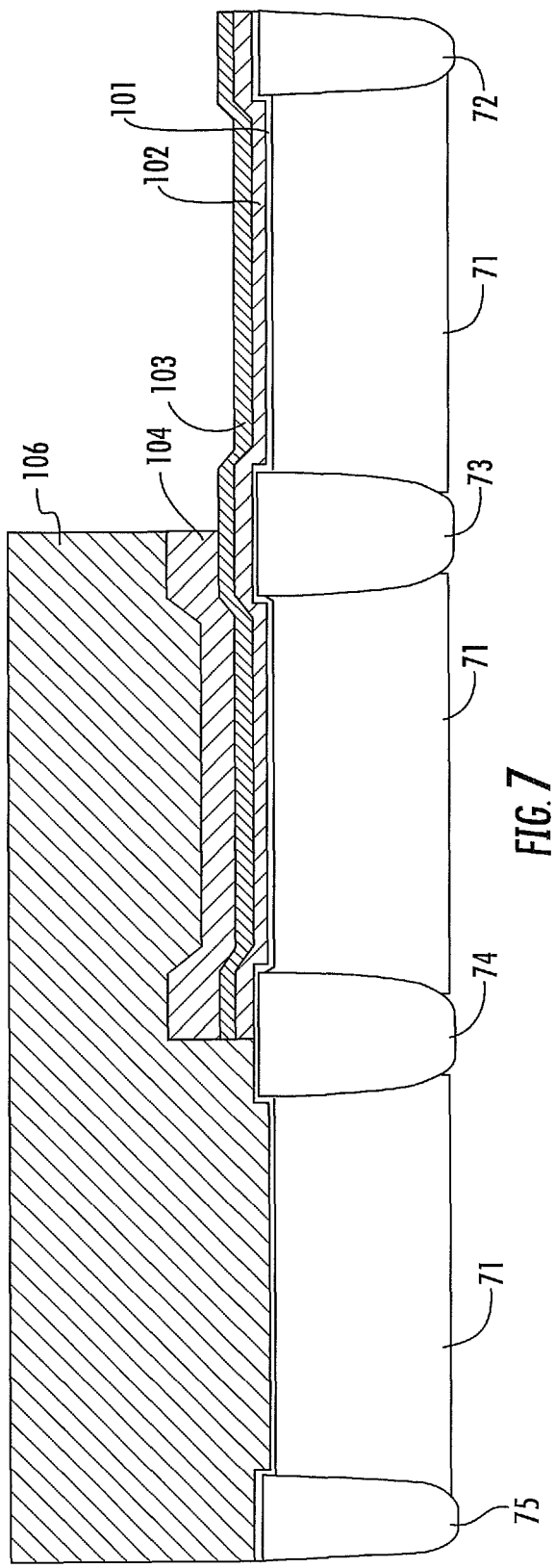
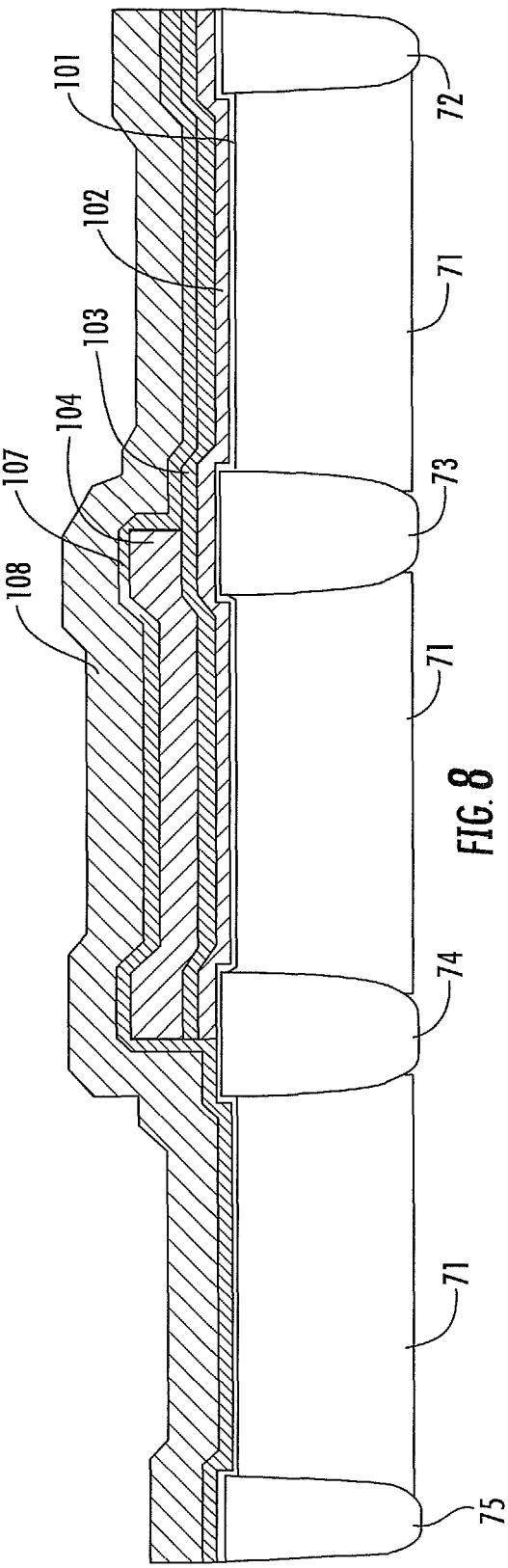
FIG. 7
FIG. 8

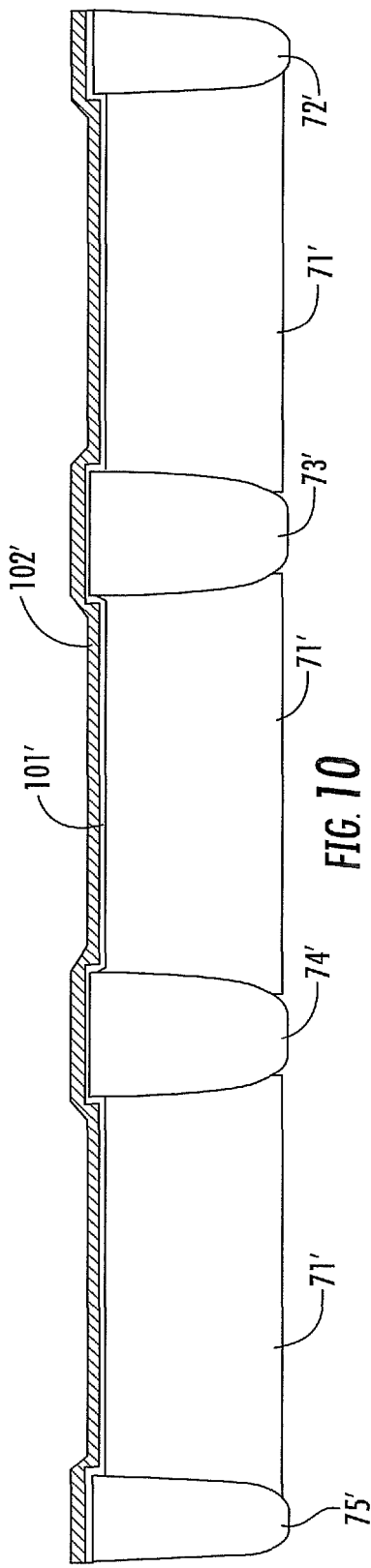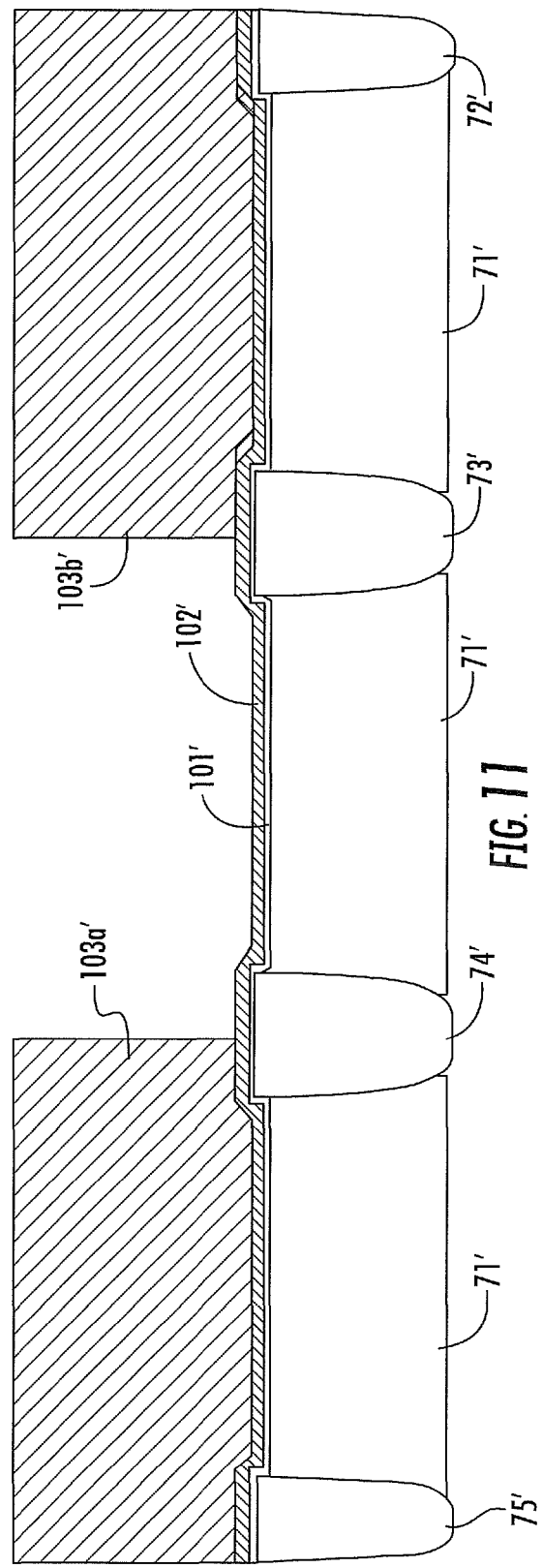

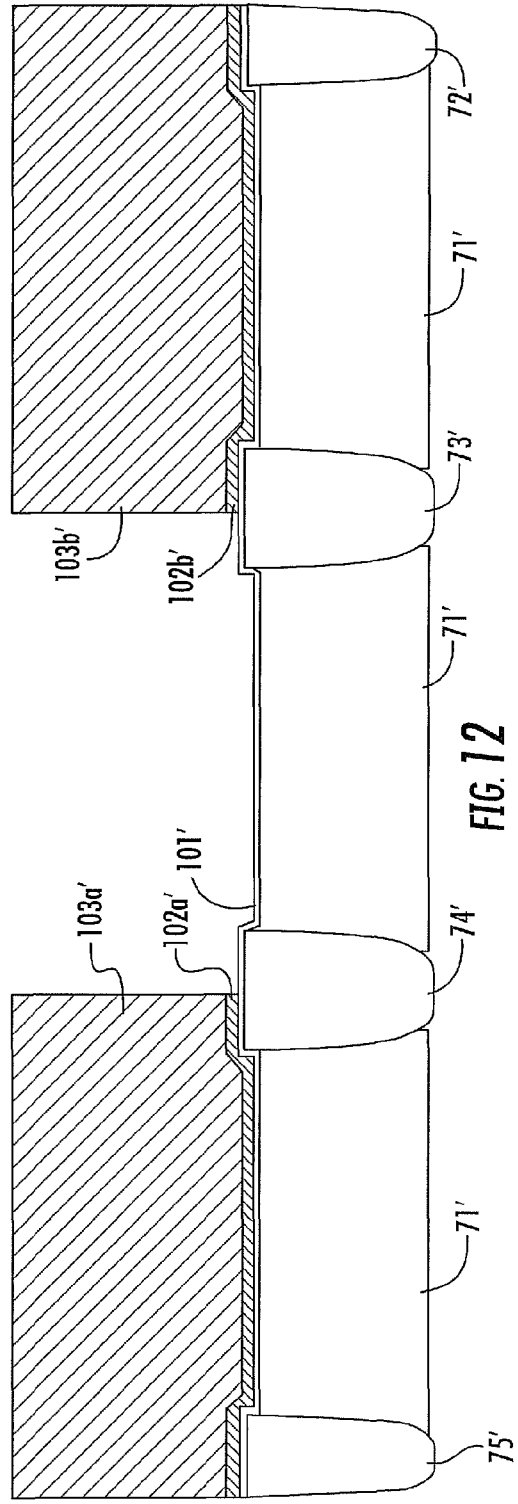
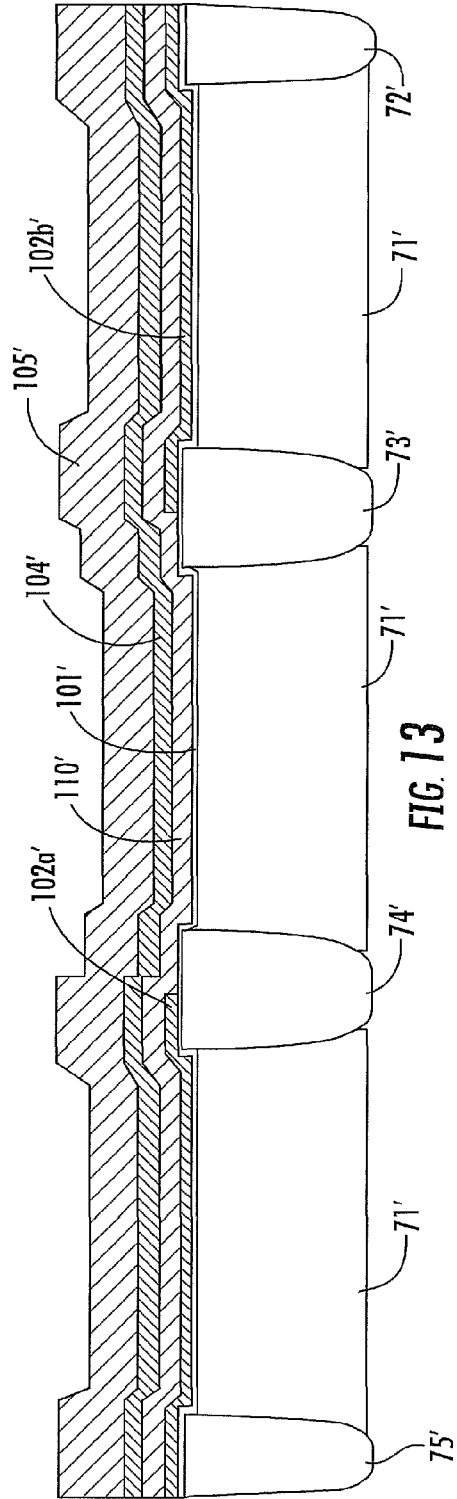
FIG. 12
FIG. 13

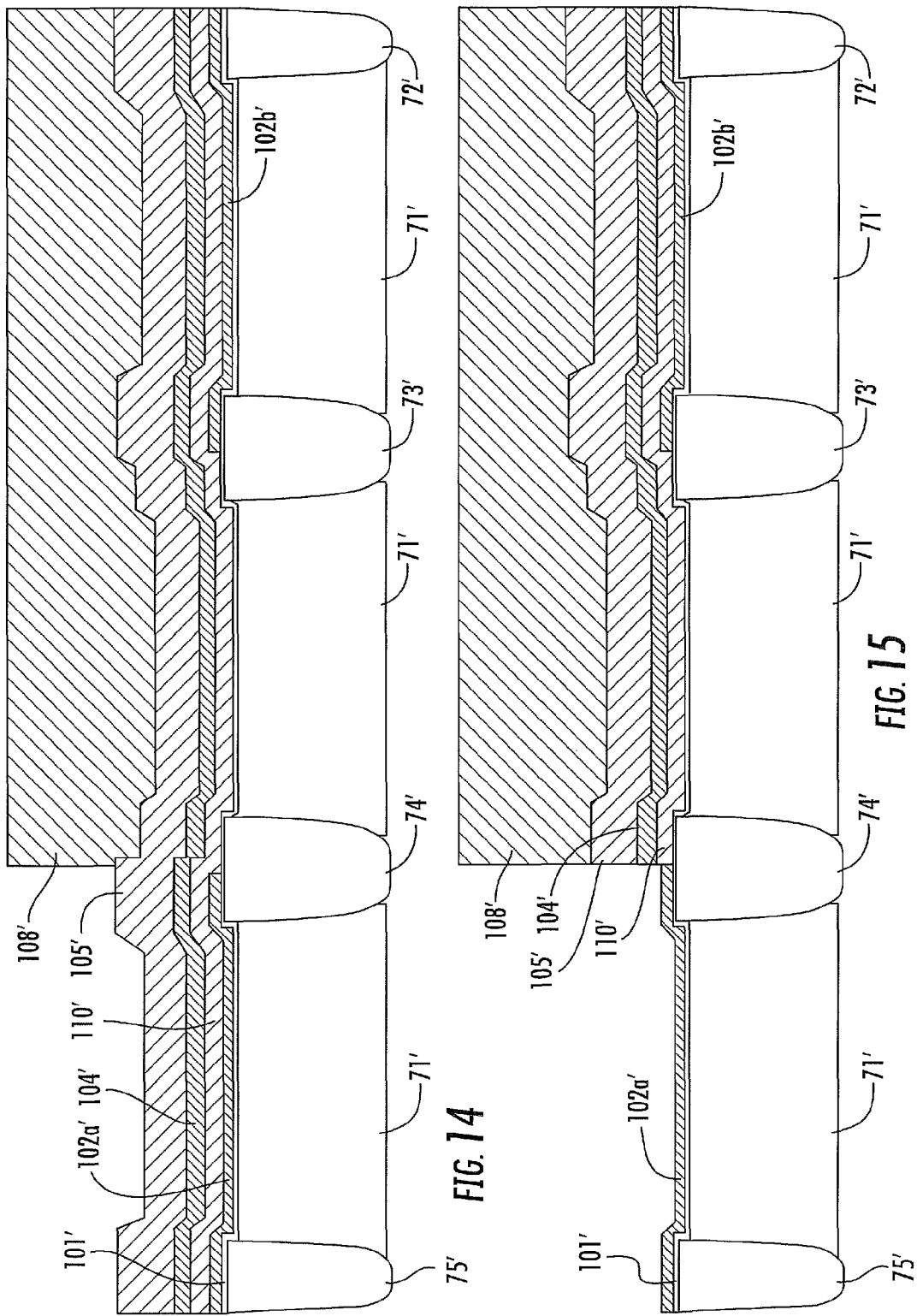

MEMORY DEVICE HAVING MULTIPLE DIELECTRIC GATE STACKS AND RELATED METHODS

TECHNICAL FIELD

The present disclosure relates to the field of electronic device manufacturing, and, more particularly, to memory devices and related methods.

BACKGROUND

Solid-state memory devices have become quite popular due to several advantages over typical active memory devices. First and foremost, the solid-state memory device comprises no moving parts, so it consumes less power and provides robust reliability. Moreover, solid-state memory devices are resistant to mechanical stress, such as impacts and vibration.

One type of memory used for solid-state memory devices is the flash memory device. The flash memory device may be based upon NAND or NOR logic gates, for example. For example, U.S. Patent Application Publication No. 2009/0080236 to Nakamura discloses a memory device. The memory device comprises a plurality of memory cells, and bit lines coupled to each memory cell. The memory device provides a supply voltage to each of the memory cells via the bit lines. Even though solid-state memory devices use less power than typical approaches, there is a desire to reduce the power consumption of solid-state memory devices.

SUMMARY

In view of the foregoing background, the present disclosure provides a memory device that is power efficient and reliable.

Generally speaking, a memory device may comprise a semiconductor substrate, and at least one memory transistor in the semiconductor substrate. The at least one memory transistor may comprise source and drain regions in the semiconductor substrate and a channel region therebetween, and a gate stack comprising a first dielectric layer over the channel region, a first diffusion barrier layer over the first dielectric layer, a first electrically conductive layer over the first diffusion barrier layer, a second dielectric layer over the first electrically conductive layer, a second diffusion barrier layer over the second dielectric layer, and a second electrically conductive layer over the second diffusion barrier layer. The first and second dielectric layers may comprise different dielectric materials, and the first diffusion barrier layer being thinner than the second diffusion barrier layer. Advantageously, the at least one memory transistor may have a great voltage threshold, thereby improving performance.

For example, the first dielectric layer may comprise HfSiON. The second dielectric layer may comprise lanthanum (La). The first and second diffusion barrier layers may each comprises titanium nitride (TiN). The first electrically conductive layer may comprise aluminum. The second electrically conductive layer may comprise polysilicon.

In some embodiments, the memory device may further comprise first and second transistors in the semiconductor substrate and adjacent the at least one memory transistor. The first transistor may comprise source and drain regions in the semiconductor substrate and a channel region therebetween, and a gate stack. The gate stack may comprise a first dielectric layer over the channel region, a second dielectric layer over the first dielectric layer, a first diffusion barrier layer over the second dielectric layer, and a first electrically conductive layer over the first diffusion barrier layer.

The second transistor may comprise source and drain regions in the semiconductor substrate and a channel region therebetween, and a gate stack. The gate stack may include a first dielectric layer over the channel region, a first diffusion barrier layer over the first dielectric layer, a first electrically conductive layer over the first diffusion barrier layer, a second diffusion barrier layer over the first electrically conductive layer, a second dielectric layer over the second diffusion barrier layer, a third diffusion barrier over the second dielectric layer, and a second electrically conductive layer over the third diffusion barrier layer.

Another aspect is directed to a method of making a memory device. The method may include forming at least one memory transistor in a semiconductor substrate by at least forming source and drain regions in the semiconductor substrate and a channel region therebetween. The forming of the at least one memory transistor may include forming a gate stack comprising a first dielectric layer over the channel region, a first diffusion barrier layer over the first dielectric layer, a first electrically conductive layer over the first diffusion barrier layer, a second dielectric layer over the first electrically conductive layer, a second diffusion barrier layer over the second dielectric layer, and a second electrically conductive layer over the second diffusion barrier layer. The first and second dielectric layers may comprise different dielectric materials, and the first diffusion barrier layer may be thinner than the second diffusion barrier layer.

Another aspect is directed to a memory device comprising a semiconductor substrate, and at least one memory transistor in the semiconductor substrate. The at least one memory transistor may include source and drain regions in the semiconductor substrate and a channel region therebetween, and a gate stack. The gate stack may include a first dielectric layer over the channel region, a second dielectric layer over the first dielectric layer, a first diffusion barrier layer over the second dielectric layer, a first electrically conductive layer over the first diffusion barrier layer, a second diffusion barrier layer over the first electrically conductive layer, and a second electrically conductive layer over the second diffusion barrier layer. The first and second dielectric layers may comprise different dielectric materials, and the first diffusion barrier layer may be thinner than the second diffusion barrier layer.

Another aspect is directed to a method for making a memory device. The method may include forming at least one memory transistor in a semiconductor substrate by at least forming source and drain regions in the semiconductor substrate and a channel region therebetween, and forming a gate stack. The gate stack may include a first dielectric layer over the channel region, a second dielectric layer over the first dielectric layer, a first diffusion barrier layer over the second dielectric layer, a first electrically conductive layer over the first diffusion barrier layer, a second diffusion barrier layer over the first electrically conductive layer, and a second electrically conductive layer over the second diffusion barrier layer. The first and second dielectric layers may comprise different dielectric materials, and the first diffusion barrier layer may be thinner than the second diffusion barrier layer.

BRIEF DESCRIPTION OF THE DRAWINGS

FIGS. 3-9 are schematic diagrams of a cross-sectional view of the steps for a method of making the memory device of FIG. 1.

FIGS. 10-17 are schematic diagrams of a cross-sectional view of the steps for a method of making the memory device of FIG. 2.

DETAILED DESCRIPTION OF THE PREFERRED EMBODIMENTS

The present embodiments will now be described more fully hereinafter with reference to the accompanying drawings, in which preferred embodiments are shown. This present embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
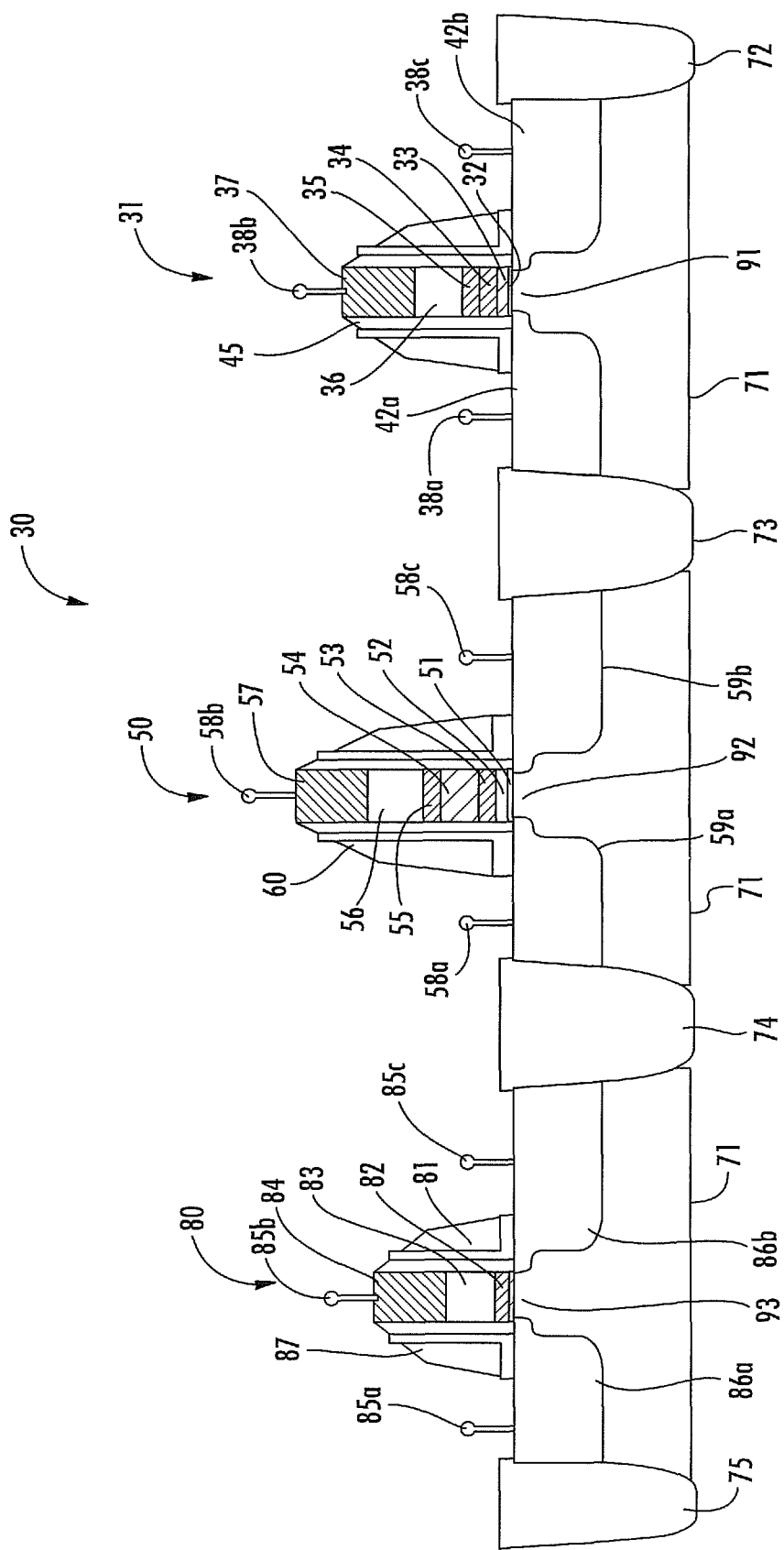
FIG. 1 is a schematic diagram of a cross-sectional view of a memory device, according to the present disclosure.

Referring now to FIG. 1, a memory device 30 according to the present disclosure is now described. The memory device 30 illustratively includes a semiconductor substrate 71, and a memory transistor 31 in the semiconductor substrate. The memory device 30 illustratively includes first 80 and second 50 transistors in the semiconductor substrate 71 and adjacent the memory transistor 31. As will be appreciated, the first and second transistors 80, 50 provide a logic circuit for the memory device 30. The memory device 30 may comprise a static random-access memory (SRAM) device. The memory device 30 illustratively includes isolations regions 72-75 for isolating the first 80, second 50, and memory 31 transistors.

The memory transistor 31 illustratively includes source and drain regions 42a-42b in the semiconductor substrate 71 and a channel region 91 therebetween, a gate stack, and a spacer 45 supporting the gate stack. The spacer 45 comprises SiN and $SiO_2$.

The gate stack illustratively includes a first dielectric layer 32 over the channel region 91, a first diffusion barrier layer 33 over the first dielectric layer, a first electrically conductive layer 34 over the first diffusion barrier layer, a second dielectric layer 35 over the first electrically conductive layer, a second diffusion barrier layer 36 over the second dielectric layer, and a second electrically conductive layer 37 over the second diffusion barrier layer. The memory transistor 31 illustratively includes terminals 38a-38c coupled to the source and drain regions 42a-42b, and the second electrically conductive layer 37.

In the illustrated embodiment, in the gate stack of the memory transistor 31, the first and second dielectric layers 32, 35 comprise different dielectric materials. For example, the first dielectric layer 32 may comprise HfSiON or $HfO_2$. The second dielectric layer 35 may comprise lanthanum (La) or lanthanum oxide ($La_2O_3$).

Additionally, the first diffusion barrier layer 33 is thinner than the second diffusion barrier layer 36. In some embodiments, the first and second diffusion barrier layers 33, 36 may each comprises titanium nitride (TiN). The first electrically conductive layer 34 may comprise aluminum (Al) or aluminum oxide (AlO). The second electrically conductive layer 37 may comprise polysilicon, for example. In one embodiment of the memory transistor 31, the combination of the lanthanum oxide and the aluminum provide for a greater threshold voltage, which is advantageous for SRAM devices, which require a higher threshold voltage than that of logic devices for lower leakage and better data retention.

The first transistor 80 illustratively includes source and drain regions 86a-86b in the semiconductor substrate 71 and a channel region 93 therebetween, a gate stack, and a spacer 87 supporting the gate stack. The gate stack illustratively includes a first dielectric layer (e.g. HfSiON or $HfO_2$) 81 over the channel region 93, a second dielectric layer (e.g. La, $La_2O_3$) 82 over the first dielectric layer, a first diffusion barrier layer (e.g. TiN) 83 over the second dielectric layer, and a first electrically conductive layer (e.g. Al, AlO) 84 over the first diffusion barrier layer. The first transistor 80 illustratively includes terminals 85a-85c coupled to the source and drain regions 86a-86b, and the first electrically conductive layer 84. Advantageously, in one embodiment, the gate stack of the first transistor 80 includes lanthanum oxide or lanthanum, which provides for a low threshold voltage. In particular, a lower threshold voltage for logic devices, here a NFET, can provide a higher drive current.

The second transistor 50 illustratively includes source and drain regions 59a-59b in the semiconductor substrate 71 and a channel region 92 therebetween, a gate stack, and a spacer 60 supporting the gate stack. The gate stack includes a first dielectric layer (e.g. HfSiON, $HfO_2$) 51 over the channel region 92, a first diffusion barrier layer (e.g. TiN) 52 over the first dielectric layer, a first electrically conductive layer (e.g. Al, AlO) 53 over the first diffusion barrier layer, a second diffusion barrier layer (e.g. TiN) 54 over the first electrically conductive layer 53, a second dielectric layer (e.g. La, $La_2O_3$) 55 over the second diffusion barrier layer 54, a third diffusion barrier (e.g. TiN) 56 over the second dielectric layer, and a second electrically conductive layer 57 over the third diffusion barrier layer. In one embodiment, the gate stack of the second transistor 50 includes aluminum, thereby advantageously providing a lower threshold voltage. Similarly, this results in lower threshold voltage for PFET, which can lead to a higher drive current with lower threshold voltage. The second transistor 50 illustratively includes terminals 58a-58c coupled to the source and drain regions 59a-59b, and the second electrically conductive layer 57.

Another aspect is directed to a method of making a memory device 30. The method includes forming at least one memory transistor 31 in a semiconductor substrate 71 by at least forming source and drain regions 42a-42b in the semiconductor substrate and a channel region 91 therebetween. The forming of the at least one memory transistor 31 includes forming a gate stack comprising a first dielectric layer 32 over the channel region 91, a first diffusion barrier layer 33 over the first dielectric layer, a first electrically conductive layer 34 over the first diffusion barrier layer, a second dielectric layer 35 over the first electrically conductive layer, a second diffusion barrier layer 36 over the second dielectric layer, and a second electrically conductive layer 37 over the second diffusion barrier layer. The first and second dielectric layers 32, 35 comprise different dielectric materials, and the first diffusion barrier layer 33 is thinner than the second diffusion barrier layer 36.

Figure 2:
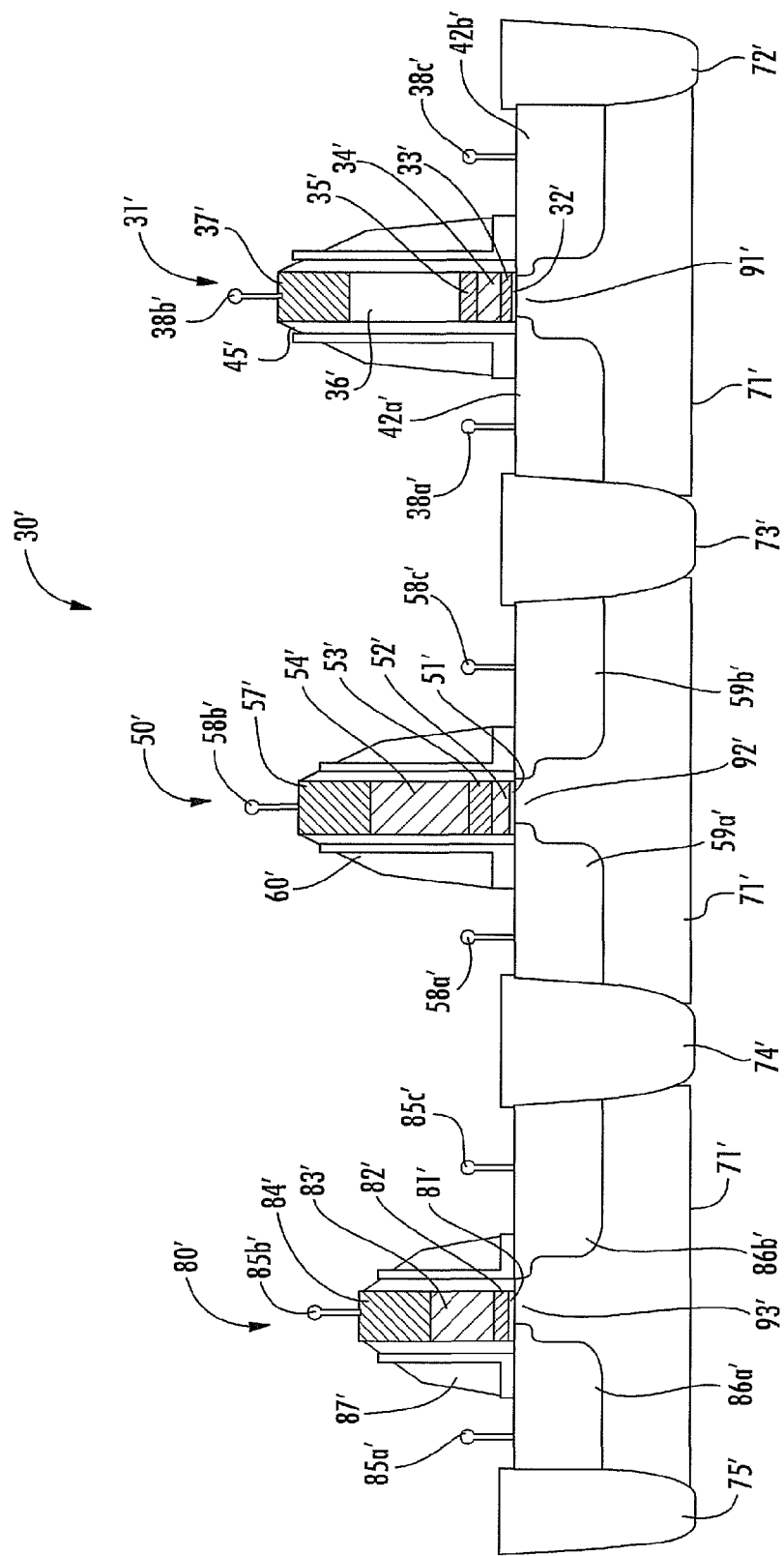
FIG. 2 is a schematic diagram of a cross-sectional view of another embodiment of a memory device, according to the present disclosure.
Figure 9:
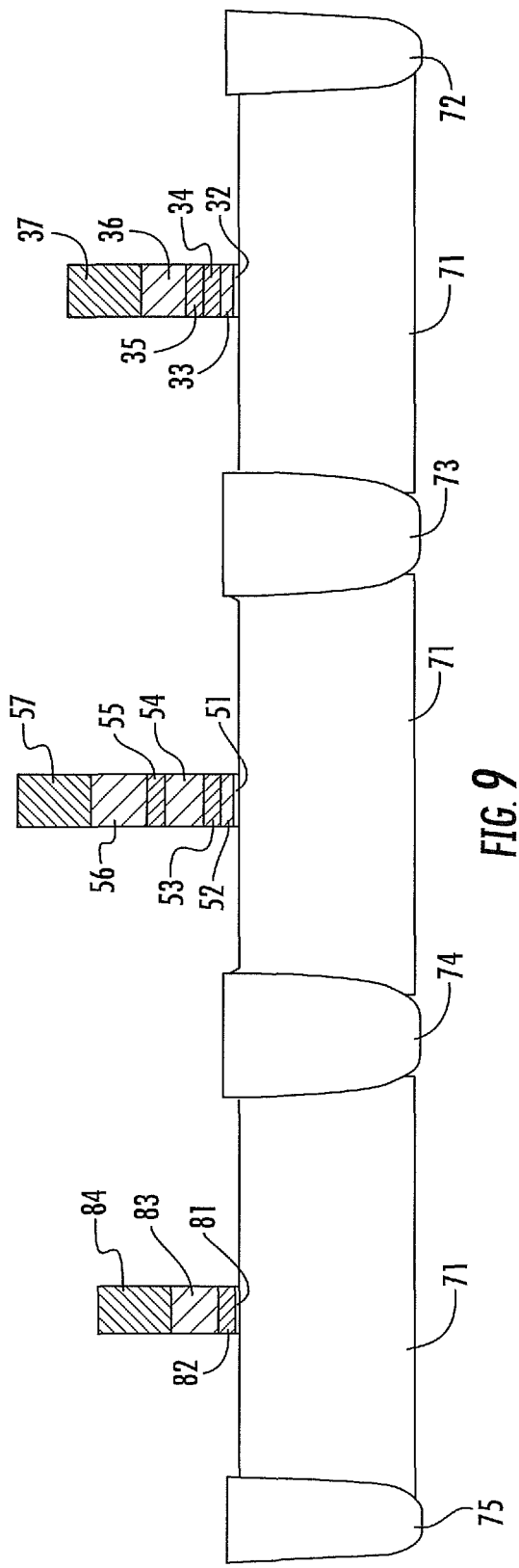
Figure 16:
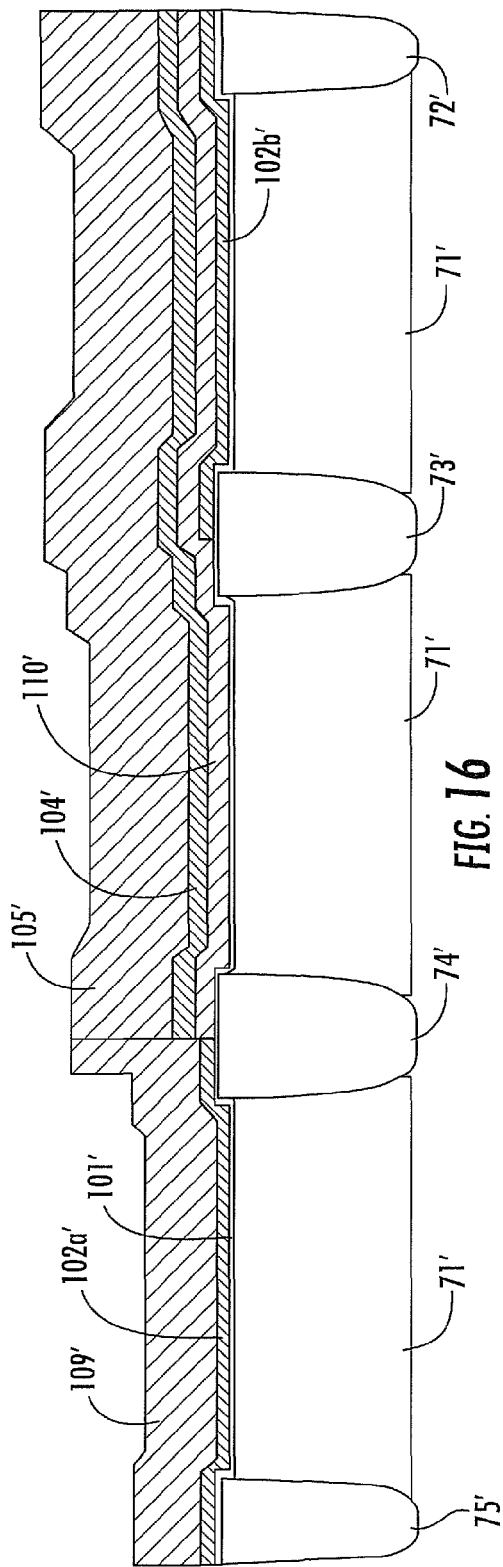
Figure 17:
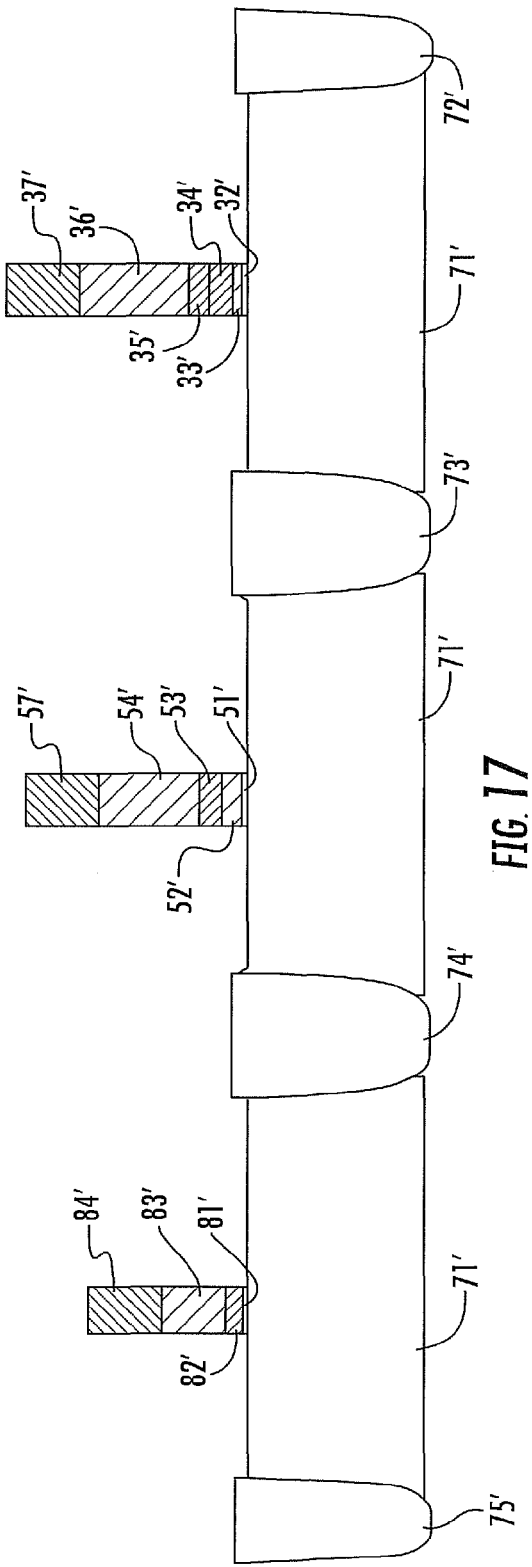

Referring now additionally to FIG. 2, another embodiment of the memory device 30' is now described. In this embodiment of the memory device 30', those elements already discussed above with respect to FIG. 1 are given prime notation and most require no further discussion herein. This embodiment differs from the previous embodiment in that this memory device 30' illustratively includes a memory transistor 31' with a gate stack comprising a first dielectric layer (e.g. HfSiON or $HfO_2$) 32' over the channel region 91', a second dielectric layer (e.g. La, $La_2O_3$) 35' over the first dielectric layer, a first diffusion barrier layer (e.g. TiN) 33' over the second dielectric layer, a first electrically conductive layer (e.g. Al, AlO) 34' over the first diffusion barrier layer, a second diffusion barrier layer (e.g. TiN) 36' over the first electrically conductive layer, and a second electrically conductive layer (e.g. polysilicon) 37' over the second diffusion barrier layer. Also, the second transistor 50' has a gate stack comprising a first dielectric layer (e.g. HfSiON or HfO$_2$) 51' over the channel region 92', a first diffusion barrier layer (e.g. TiN) 52' over the first dielectric layer, a first electrically conductive layer (e.g. Al, AlO) 53' over the first diffusion barrier layer, a second diffusion barrier layer (e.g. TiN) 54' over the first electrically conductive layer, and a second electrically conductive layer (e.g. polysilicon) 57' over the second diffusion barrier layer.

Another aspect is directed to a method for making a memory device 30'. The method may include forming at least one memory transistor 31' in a semiconductor substrate 71' by at least forming source and drain regions 42a'-42b' in the semiconductor substrate and a channel region 91' therebetween, and forming a gate stack. The gate stack includes a first dielectric layer 32' over the channel region 91', a second dielectric layer 35' over the first dielectric layer, a first diffusion barrier layer 33' over the second dielectric layer, a first electrically conductive layer 34' over the first diffusion barrier layer, a second diffusion barrier layer 36' over the first electrically conductive layer, and a second electrically conductive layer 37' over the second diffusion barrier layer. The first and second dielectric layers 32', 35' comprise different dielectric materials, and the first diffusion barrier layer 33' is thinner than the second diffusion barrier layer 36'.

Referring now to FIGS. 3-9, a method for making the memory device 30 is now described. The method includes depositing a first dielectric (e.g. HfSiON or HfO$_2$) layer 101 (thickness of about 20Å) on the substrate 71. As illustrated, the substrate 71 illustratively includes a plurality of isolation regions 72-75. The method also includes forming a first thin diffusion barrier (e.g. TiN) layer 102 (thickness of about 10 Å) on the first dielectric layer 101, a first electrically conductive (e.g. Al, AlO) layer 103 (thickness of about 2-8 Å) on the first thin diffusion barrier layer, and a second thick diffusion barrier layer 103 (thicker than the first layer, about 35 Å) on the first electrically conductive layer. The method includes forming a photoresist layer 105 on the second and memory transistors. The first and second diffusion barrier layers and the first electrically conductive layers 102-104 are etched from the first transistor.

The method includes forming a second photoresist layer 106 on the first and second transistors. The method includes removing (e.g. dry, wet etching) the second diffusion barrier layer 104 from the memory transistor, and forming a second dielectric layer (e.g. La, La$_2$O$_3$) 107 (thickness of about 2 Å) and a third barrier diffusion layer (e.g. TiN) 108 (thickness of about 35 Å) over the first, second, and memory transistors. The method includes forming a second electrically conductive layer (e.g. polysilicon) on the third barrier diffusion layer 108 (not shown), and removing (e.g. dry, wet etching) the first, second, and memory transistors to define the gate stacks therefor. The method also includes forming the spacers 45, 60, 87 (FIG. 1) around the gate stacks of each transistor 31, 50, 80 to provide the final product, as shown in FIG. 1.

Advantageously, in one embodiment, the first transistor has a gate stack with a lanthanum oxide layer 82 between the HfSiON layer 81 and the first TiN layer 83, and the second transistor includes aluminum 53 and lanthanum oxide 55 layers sandwiching a thick TiN layer 54, each providing a lower threshold voltage for the first and second transistors. On the other hand, the memory transistor includes aluminum 34 and lanthanum oxide 35 layers, thereby providing a high threshold voltage.

Referring now to FIGS. 10-17, a method for making the memory device 30' is now described. The method includes depositing a first dielectric (e.g. HfSiON or HfO$_2$) layer 101' (thickness of about 20 Å), and a second dielectric layer (e.g. lanthanum oxide) 102' (thickness of about 2 Å) thereon.

The method includes forming a photoresist layer 103a'-103b' on the first and memory transistors. The second dielectric layer (e.g. La, La$_2$O$_3$) 102' is removed (e.g. dry, wet etching) from the second transistor, defining second dielectric layers 102a'-102b' on the first and memory transistors. The method includes forming a first thin diffusion barrier (e.g. TiN) layer 110' (thickness of about 10 Å) on the first, second, and memory transistors, a first electrically conductive (e.g. aluminum) layer 104' (thickness of about 2-8 Å) on the first thin diffusion barrier layer, and a second thick diffusion barrier layer 105' (thicker than the first layer, about 35 Å) on the first electrically conductive layer.

The method includes forming a second photoresist layer 108' on the second and memory transistors. The method includes removing (e.g. dry, wet etching) the first thin diffusion barrier layer 110', the first electrically conductive (e.g. aluminum) layer 104', and the second thick diffusion barrier layer 105' over the first transistor. The method includes forming a third diffusion barrier layer 109' (thickness of about 35 Å) on the first, second, and memory transistors, which merges with the top portion of the diffusion barrier layer 105' on the second and memory transistors.

The method includes forming a second electrically conductive layer (e.g. polysilicon) on the third diffusion barrier layer 109' (not shown), and removing (e.g. dry, wet etching) the first, second, and memory transistors to define the gate stacks therefor. The method also includes forming the spacers 45', 60', 87' (FIG. 2) around the gate stacks of each transistor 31', 50', 80' to provide the final product, as shown in FIG. 2.

Advantageously, in one embodiment, the first transistor has a gate stack with a lanthanum oxide layer 82' between the HfSiON layer 81' and the first TiN layer 83', and the second transistor includes aluminum 53' sandwiched between a thick TiN layer 54' and a thin TiN layer 52', each providing a lower threshold voltage for the first and second transistors. On the other hand, the memory transistor includes aluminum 35' and lanthanum oxide 33' layers, thereby providing a high threshold voltage.

Other features relating to memory devices are disclosed in co-pending application: titled "MEMORY DEVICE HAVING MULTIPLE DIELECTRIC GATE STACKS WITH FIRST AND SECOND DIELECTRIC LAYERS AND RELATED METHODS," U.S. patent application Ser. No. 13/852,720 filed Mar. 28, 2013, which is incorporated herein by reference in its entirety.

Many modifications and other embodiments of the present embodiments will come to the mind of one skilled in the art having the benefit of the teachings presented in the foregoing descriptions and the associated drawings. Therefore, it is understood that the present embodiments are not to be limited to the specific embodiments disclosed, and that modifications and embodiments are intended to be included within the scope of the appended claims.

That which is claimed is:
1. A memory device comprising:
a semiconductor substrate; and
at least one memory transistor in said semiconductor substrate and comprising source and drain regions in said semiconductor substrate and a channel region therebetween, and a gate stack comprising a first dielectric layer over said channel region, a first diffusion barrier layer over said first dielectric layer, a first electrically conductive layer over said first diffusion barrier layer, a second dielectric layer over said first electrically conductive layer, a second diffusion barrier layer over said second dielectric layer, and a second electrically conductive layer over said second diffusion barrier layer;

said first and second dielectric layers comprising different dielectric materials, and said first diffusion barrier layer being thinner than said second diffusion barrier layer.

2. The memory device of claim 1 wherein said first dielectric layer comprises HfSiON.

3. The memory device of claim 1 wherein said second dielectric layer comprises lanthanum (La).

4. The memory device of claim 1 wherein said first and second diffusion barrier layers each comprises titanium nitride (TiN).

5. The memory device of claim 1 wherein said first electrically conductive layer comprises aluminum.

6. The memory device of claim 1 wherein said second electrically conductive layer comprises polysilicon.

7. The memory device of claim 1 further comprising first and second transistors in said semiconductor substrate and adjacent said at least one memory transistor.

8. The memory device of claim 7 wherein said first transistor comprises:

source and drain regions in said semiconductor substrate and a channel region therebetween; and a gate stack comprising a first dielectric layer over said channel region, a second dielectric layer over said first dielectric layer, a first diffusion barrier layer over said second dielectric layer, and a first electrically conductive layer over the first diffusion barrier layer.

9. The memory device of claim 8 wherein said second transistor comprises:

source and drain regions in said semiconductor substrate and a channel region therebetween; and a gate stack and comprising a first dielectric layer over said channel region, a first diffusion barrier layer over said first dielectric layer, a first electrically conductive layer over said first diffusion barrier layer, a second diffusion barrier layer over the first electrically conductive layer, a second dielectric layer over said second diffusion barrier layer, a third diffusion barrier over said second dielectric layer, and a second electrically conductive layer over said third diffusion barrier layer.

10. A memory device comprising:

a semiconductor substrate; and at least one memory transistor in said semiconductor substrate and comprising source and drain regions in said semiconductor substrate and a channel region therebetween, and a gate stack comprising a first dielectric layer over said channel region, a first diffusion barrier layer over said first dielectric layer, a first electrically conductive layer over said first diffusion barrier layer, a second dielectric layer over said first electrically conductive layer, a second diffusion barrier layer over said second dielectric layer, and a second electrically conductive layer over said second diffusion barrier layer;

said first and second dielectric layers comprising different dielectric materials, and said first diffusion barrier layer being thinner than said second diffusion barrier layer, the second dielectric layer comprising lanthanum, the first electrically conductive layer comprising aluminum.

11. The memory device of claim 10 wherein said first dielectric layer comprises HfSiON.

12. The memory device of claim 10 wherein said first and second diffusion barrier layers each comprises titanium nitride (TiN).

13. The memory device of claim 10 wherein said second electrically conductive layer comprises polysilicon.

14. The memory device of claim 10 further comprising first and second transistors in said semiconductor substrate and adjacent said at least one memory transistor.

* * * * *